United States Patent
Stan et al.

(10) Patent No.: US 8,957,306 B2
(45) Date of Patent: *Feb. 17, 2015

(54) MULTIJUNCTION SOLAR CELL WITH TWO STEP DIFFUSION REGION IN SUBSTRATE

(76) Inventors: Mark A. Stan, Albuquerque, NM (US); Nein Y. Li, Albuquerque, NM (US); Frank A. Spadafora, Baden, PA (US); Hong Q. Hou, Arcadia, CA (US); Paul R. Sharps, Albuquerque, NM (US); Navid S. Fatemi, Albuquerque, NM (US)

( * ) Notice: Subject to any disclaimer, the term of this patent is extended or adjusted under 35 U.S.C. 154(b) by 823 days.

This patent is subject to a terminal disclaimer.

(21) Appl. No.: 12/041,490

(22) Filed: Mar. 3, 2008

(65) Prior Publication Data

US 2008/0149177 A1    Jun. 26, 2008

Related U.S. Application Data

(60) Continuation of application No. 09/885,319, filed on Jun. 19, 2001, now Pat. No. 7,339,109, and a continuation of application No. 11/143,516, filed on Jun. 2, 2005, now Pat. No. 7,629,240, which is a division of application No. 09/885,319, filed on Jun. 19, 2001, now Pat. No. 7,339,109.

(60) Provisional application No. 60/212,552, filed on Jun. 20, 2000.

(51) Int. Cl.
| | |
|---|---|
| *H01L 31/00* | (2006.01) |
| *H01L 31/078* | (2012.01) |
| *H01L 21/22* | (2006.01) |
| *H01L 31/18* | (2006.01) |
| *H01L 21/02* | (2006.01) |

(52) U.S. Cl.
CPC .......... *H01L 31/078* (2013.01); *H01L 21/2205* (2013.01); *H01L 31/1852* (2013.01); *H01L 21/02381* (2013.01); *H01L 21/02461* (2013.01); *H01L 21/02463* (2013.01); *H01L 21/02543* (2013.01); *Y02E 10/544* (2013.01)
USPC ........................................................ 136/255

(58) Field of Classification Search
USPC ................................................. 136/255, 256
See application file for complete search history.

(56) References Cited

U.S. PATENT DOCUMENTS

| | | | |
|---|---|---|---|
| 4,001,864 A | 1/1977 | Gibbons | |
| 4,322,571 A * | 3/1982 | Stanbery | ........................ 136/255 |
| 4,634,605 A | 1/1987 | Wiesmann | |
| 5,342,453 A | 8/1994 | Olson | |
| 5,571,339 A | 11/1996 | Ringel et al. | |
| 5,923,951 A | 7/1999 | Goossen et al. | |

(Continued)

OTHER PUBLICATIONS

Chiang et al., "Large Area GaInP2/GaAs/Ge Multijunction Solar Cells for Space Applications," 2120-2123(1994).

(Continued)

*Primary Examiner* — Jennifer Michener
*Assistant Examiner* — Dustin Q Dam

(57) ABSTRACT

A solar cell having a first subcell including a germanium (Ge) substrate having a diffusion region doped with n-type dopants including phosphorus and arsenic, wherein the upper portion of such diffusion region has a higher concentration of phosphorus (P) atoms than arsenic (As) atoms, and a second subcell including a layer of either gallium arsenide (GaAs) or indium gallium arsenide (InGaAs) disposed over the substrate.

15 Claims, 5 Drawing Sheets

(56) References Cited

U.S. PATENT DOCUMENTS

| | | |
|---|---|---|
| 6,300,558 B1 | 10/2001 | Takamoto et al. |
| 6,380,601 B1 | 4/2002 | Ermer et al. |
| 6,483,134 B1 | 11/2002 | Weatherford et al. |

OTHER PUBLICATIONS

Chiang et al., "Experimental Results of GaInP2/GaAs/Ge Triple Junction Cell Development for Space Power Systems," 25$^{th}$ IEEE PVSC, 183-186 (1996).

Friedman et al., "Back Surface Fields for GaInP2 Solar Cells," IEEE, 358-360 (1991).

Sharps, "Growth and Development of GaInAsP for Use in High-Efficiency Solar Cells," NREL, 1-27 (1994).

Takamoto et al., "High Efficeincy Monolithic InGaP/GaAs Tandem Solar Cells with Improved Top-Cell Back-Surface-Field Layers," IEEE (1995).

Yamaguchi, "Compound Semiconductor Solar Cells, Present Status," NTT Opto-electronics Labs., 5:143-155 (1990).

Yamaguchi, M. "Compound Semiconductor Solar Cells, Present Status." Optoelectronics—Devices and Technologies. vol. 5, No. 2, pp. 143-154. Dec. 1990. NTT Opto-electronics Labs. Tokyo, Japan.

Friedman, D.J., et al. "Back Surface Fields for GaInP2 Solar Cells." Conf. Record of the 22nd IEEE PVSC. vol. 1, pp. 358-360. 1991. IEEE, Piscataway, NJ.

Chiang, P.K., et al., "Large Area GaInP2/GaAs/Ge Multijunction Solar Cells for Space Applications." Conf. Record of the 24th IEEE PVSC. vol. 2, pp. 2120-2123. Dec. 1994. IEEE, Piscataway, NJ.

Sharps, P.R., "Growth and Development of GaInAsP for Use in High-Efficiency Solar Cells." Final Report to the National Renewable Energy Laboratory, pp. 1-27, with appendix. Oct. 1994. NREL, Golden, CO.

Kurita, H., et al., High Efficiency Monolithic InGaP/GaAs Tandem Solar Cells with Improved Top-Cell Back-Surface-Field Layers. Conf. Proceedings of the 7th International Conf. on Indium Phosphide and Related Materials. pp. 516-519. May 9-13, 1995. IEEE, Piscataway, NJ.

Chiang, P.K., et al., "Experimental Results of GaInP2/GaAs/Ge Triple Junction Cell Development for Space Power Systems." 25th IEEE PVSC. pp. 183-186. May 13-17, 1996. IEEE, Piscataway, NJ.

\* cited by examiner

MULTIJUNCTION SOLAR CELL WITH TWO STEP DIFFUSION REGION IN SUBSTRATE

PRIORITY

This application is a continuation of and claims priority from U.S. Ser. No. 09/885,319, filed on Jun. 19, 2001, now U.S. Pat. No. 7,339,109 which, in turn, claims priority from U.S. Ser. No. 60/212,552, filed on Jun. 20, 2000. This application also claims priority from U.S. Ser. No. 11/143,516, filed on Jun. 2, 2005, now U.S. Pat. No. 7,629,240 which is a divisional of and claims priority from U.S. Ser. No. 09/885,319, which, in turn, claims priority from U.S. Ser. No. 60/212,552. The disclosure of these applications are incorporated herein by reference in their entirety.

GOVERNMENT RIGHTS NOTICE

Portions of the material in this specification arose as a result of Government support under contracts between Emcore Corporation and a U.S. Government Agency. Accordingly, the U.S. Government has certain rights in this invention.

FIELD OF THE INVENTION

The present invention relates to solar cells and methods for their fabrication, and more particularly to optimizing the efficiency of germanium (Ge) junctions of multi-junction solar cells having a stacked semiconductor layer structure to provide a high efficiency for the conversion of incident light into electrical energy.

DESCRIPTION OF THE RELATED ART

Solar cells are one of the most important new energy sources that have become available in the past several years. Considerable effort has gone into solar cell development. Most of the work has involved using silicon-based semiconductor materials. As a result, solar cells are currently being used in a number of commercial and consumer-oriented applications. While significant progress has been made in this area, the requirement for solar cells to meet the needs of more sophisticated applications has not kept pace with demand. Applications such as satellites used in mobile and telephone communications have dramatically increased the demand for solar cells with improved power and energy conversion characteristics.

In satellite and other space related applications, the size, mass, and cost of a satellite power system is dependent on the power and energy conversion efficiency of the solar cells used. Putting it another way, the size of the payload and the availability of on-board services are proportional to the amount of power provided. Thus, as the payloads become more sophisticated, solar cells, which act as the power conversion devices for the on-board power systems, becomes increasingly more important.

The energy conversion characteristic of a solar cell is dependent on the effective utilization of the available solar spectrum. Currently, a state-of-the-art solar cell is a multi-junction device that uses layers of indium gallium phosphide (InGaP), gallium arsenide (GaAs), and germanium (Ge). This triple-junction structure is based on an older dual-junction solar cell structure made of indium gallium phosphide (In-GaP) and gallium arsenide (GaAs) covering the absorption spectrum from UV to 890 nm. The addition of a germanium (Ge) junction to the dual-junction structure extends the absorption edge to 1800 nm. Since the germanium (Ge) junction causes increased access to the solar spectrum, the current generated in the germanium (Ge) junction is usually very high. The germanium (Ge) junction is not likely to limit the overall current of this serially connected multi-junction structure. Thus, the contribution of a germanium (Ge) junction improves the energy conversion efficiency by adding open-circuit voltage. Therefore, it becomes extremely important to optimize the open-circuit voltage of the germanium (Ge) junction without sacrificing the overall performance of the solar cell.

FIG. 1 is a diagram that depicts the formation of a typical diffused germanium (Ge) junction on a p-type substrate. As FIG. 1 illustrates, the junction is formed by the diffusion of arsenic (As) and/or phosphorus (P) into the germanium (Ge) so that the conduction element of p-type substrate is converted into n-type. Arsenic is an n-type impurity in germanium with a solubility, at metal organic chemical vapor deposition (MOCVD) growth temperatures, of $8 \times 10^{19}$ cm$^{-3}$. In the prior art an electro-optically active germanium junction is formed as a consequence of arsenic diffusion into the p-type germanium substrate during the growth of arsenic-containing overlying epilayers.

A critical factor in maximizing the open circuit voltage characteristic is the control of the depth of the germanium (Ge) junction. As a consequence of the solid state diffusion process, the n-type germanium emitter is highly doped. As a result, most of the photo-generated carriers in this region will recombine before collecting at the n-p junction. This leads to an increased reverse saturation current (or referred to as "dark current") and in a concomitant reduction in the open circuit voltage ($V_{oc}$) of the cell. Additionally, one would like to minimize the junction depth because the highly doped emitter region acts as an absorber of the incident long wavelength solar radiation. The increased absorption of long wavelength radiation causes lower short circuit current ($J_{sc}$) in the cell, which in turn, reduces the open circuit current of the stack. This results in less than optimum performance.

The depth of the diffused germanium junction is a function of the thermal load that results from the time-temperature profile of the epilayers grown on top of the p-type germanium substrate. Optimization of the germanium junction cannot be accomplished without affecting the subsequent dual junction epilayer device process. More specifically, to control the arsenic diffusion of the germanium substrate, the growth time and temperature of the overlying dual junction epilayer structure must be minimized. Thus, the integrity of the dual junction epilayer structure may be compromised to obtain an appropriate arsenic diffusion profile on the germanium substrate.

SUMMARY OF THE INVENTION

A preferred embodiment of the present invention provides a method for optimizing the open-circuit voltage of the germanium (Ge) junction in the multi-junction solar cell structure.

In accordance with the purpose of the invention, as embodied and broadly described herein, the invention relates to an alternative and more effective way of controlling the diffusion resulting in the formation of the active germanium junction. Diffused junction depths ⅕-½ of that obtained in the prior art are typical for the invention described below. A shallow n-p germanium junction of the present invention allows for the manufacture of monolithic triple junction solar cells with 1 sun AM0 efficiencies in excess of 26%.

Advantages of the invention will be set forth, in part, in the description that follows and, in part, will be understood by those skilled in the art from the description herein.

BRIEF DESCRIPTION OF THE DRAWINGS

The accompanying drawings, which are incorporated in and constitute a part of this specification, illustrate several embodiments of the invention and, together with the description, serves to explain the principles of the invention.

DETAILED DESCRIPTION OF A PREFERRED EMBODIMENT

The present invention now will be described more fully with reference to the accompanying drawings, in which the preferred embodiments of the invention are shown. The present invention may, however, be embodied in many different forms and should not be construed as being limited to the embodiments set forth herein; rather these embodiments are provided so that this disclosure will be thorough and complete and will fully convey the invention to those skilled in the art.

Figure 2:
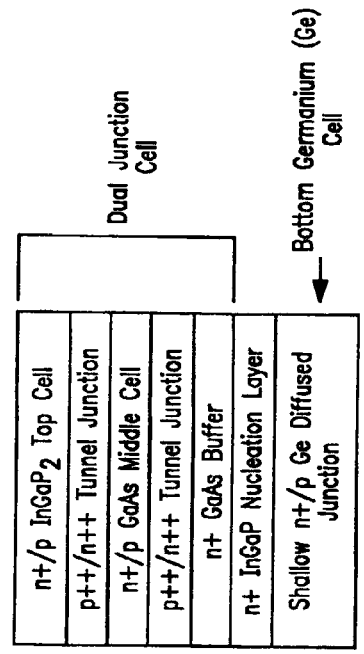
FIG. 2 is a block diagram that shows a schematic cross section of a triple junction solar cell in which an embodiment of the present invention has been implemented.
Figure 1:
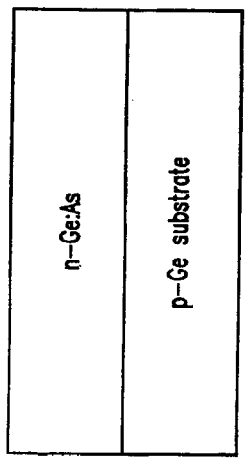
FIG. 1 is a diagram that depicts the formation of the diffused germanium (Ge) junction on a p-type substrate.

FIG. 2 is a block diagram that shows a schematic cross section of a triple junction solar cell in which an embodiment of the present invention has been implemented. In the present invention a phosphorus containing compound, InGaP, with a lattice parameter equal to that of the germanium substrate is inserted as a nucleation layer between the germanium substrate and the overlying dual junction epilayers as shown in FIG. 2. The indium gallium phosphide (InGaP) nucleation layer serves as a diffusion barrier to arsenic contained in the overlying dual junction layers. Additionally, the nucleation layer serves as a source of n-type dopant used to form the shallow diffused germanium junction. Phosphorus is an n-type impurity with a solubility of $2 \times 10^{20}$ cm$^{-3}$ at metal organic chemical vapor deposition (MOCVD) growth temperatures.

Data indicates that for the range of temperatures used in the metal organic chemical vapor deposition (MOCVD) growth of solar cell epilayers structures, the diffusion coefficient of phosphorus into a germanium substrate is approximately ⅓ that of arsenic diffusion coefficient into germanium. Therefore, given an equal surface concentration and diffusion time, the phosphorus impurity would diffuse into the germanium to a depth of $(⅓)^{1/2}$ relative to that of arsenic in germanium. However, arsenic (As) and phosphorus (P) are not present in equal surface concentrations at the same temperatures. Solid state diffusion proceeds typically via vacancy and interstitial formation, which are thermally activated processes. In the case of indium gallium phosphorus (InGaP), this requires the breaking of either the indium phosphorus (In—P) or gallium phosphorus (Ga—P) bonds whereas in gallium arsenic (GaAs) it requires the breaking of the gallium arsenic bond (Ga—As). Available data indicates that the gallium phosphorus (Ga—P) and indium phosphorus (In—P) bonds are stronger than the gallium arsenic bond (Ga—As). As such, the population of phosphorus (P) vacancies in indium gallium phosphorus (InGaP) is lower than that of the arsenic (As) vacancies in gallium arsenic (GaAs) at the same temperature. Consequently, the concentration of arsenic present at the gallium arsenic germanium interface (GaAs—Ge) is higher than that of phosphorus at the indium gallium phosphide germanium interface (InGaP—Ge).

Figure 3:
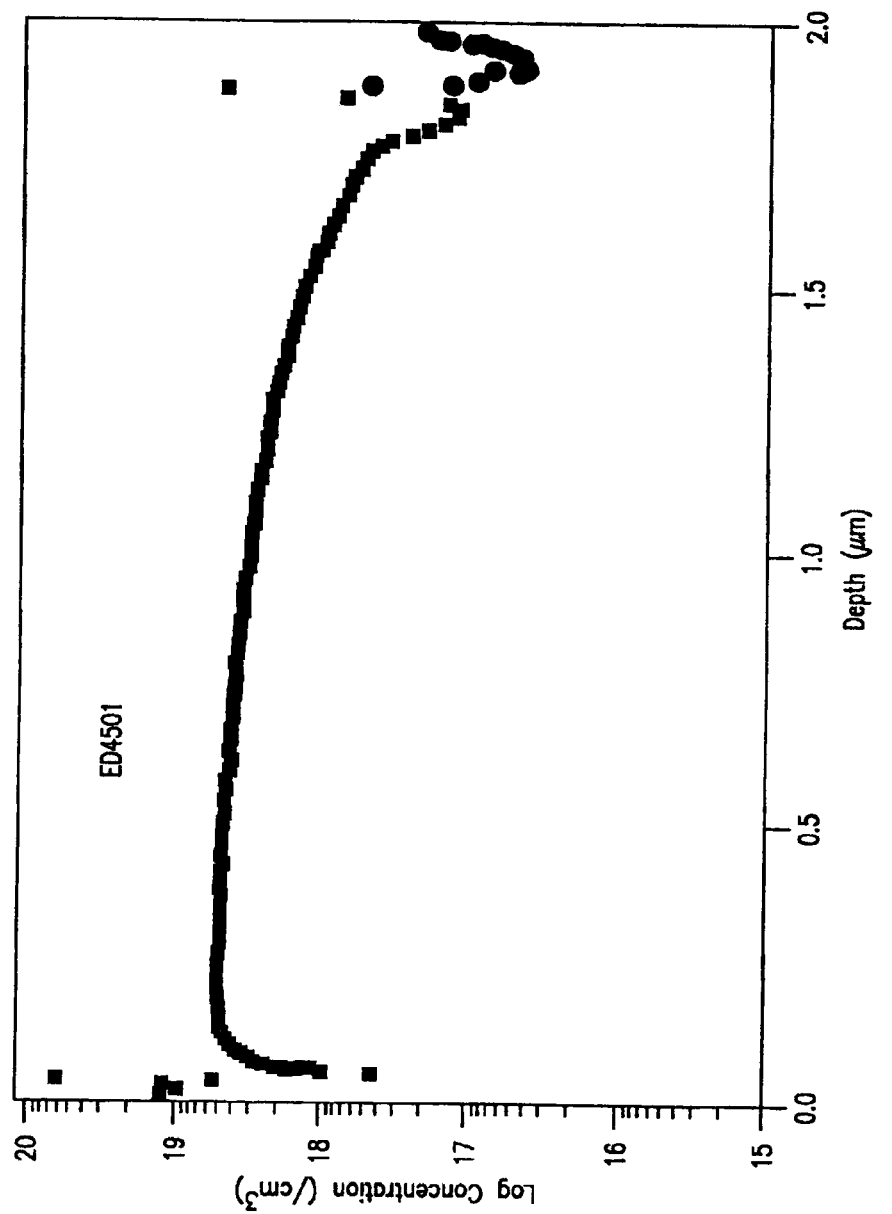
FIG. 3 shows an electrochemical etch profile of a diffused germanium junction of a typical dual junction with a gallium arsenide (GaAs) nucleation layer next to the p-Ge substrate.

FIG. 3 shows an electrochemical etch profile of a diffused germanium junction in a typical dual junction device with a gallium arsenide (GaAs) nucleation layer next to the p-Ge substrate. The junction depth in this case is approximately 1.8 μm.

Figure 4:
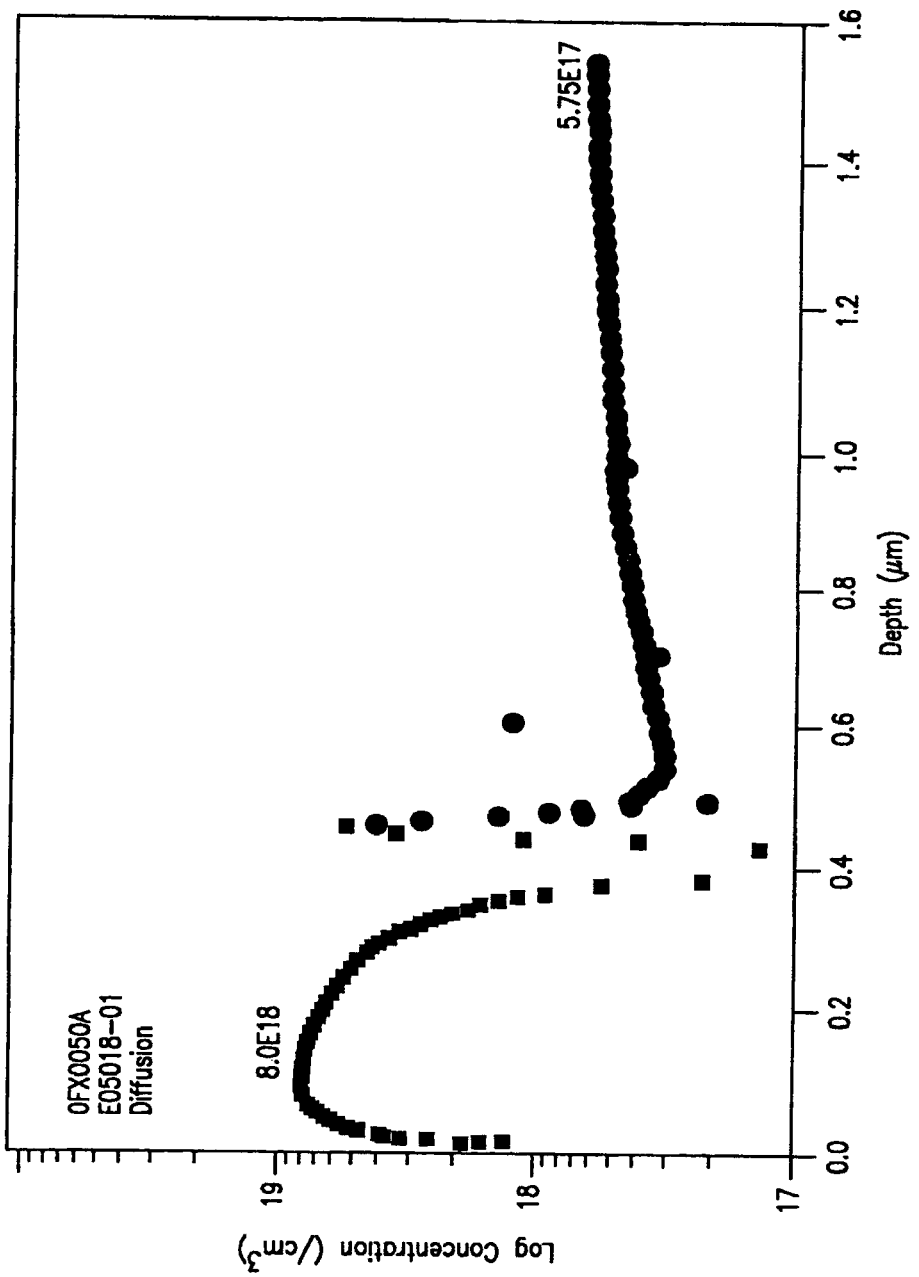
FIG. 4 shows an electrochemical etch profile of a diffused germanium junction with an indium gallium phosphide (InGaP) nucleation layer between the gallium arsenide (GaAs) and the p-Ge substrate that embodies the present invention.

FIG. 4 shows an electrochemical etch profile of a sample with a 350 Å indium gallium phosphide (InGaP) nucleation layer between the gallium arsenide (GaAs) and the p-Ge substrate that embodies the present invention. Here, the germanium (Ge) junction depth is 0.4 μm. As such the germanium (Ge) junction depth has been reduced by more than a factor of 4.

Figure 5:
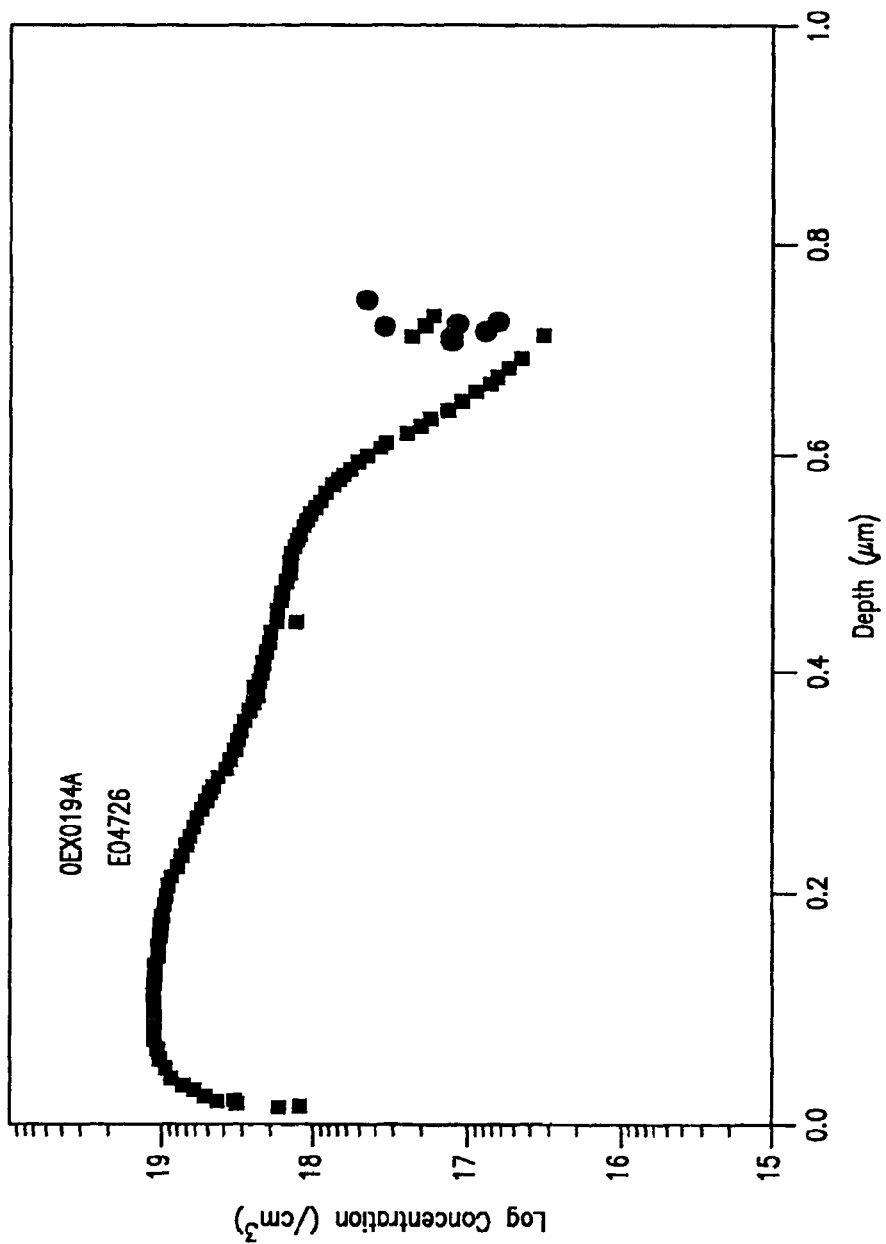
FIG. 5 is an electrochemical etch profile of a diffused germanium junction utilizing a thinner indium gallium phosphide (InGaP) nucleation layer in yet another embodiment of the present invention.

Reference is now made to FIG. 5 showing an electrochemical etch profile of the effect of utilizing a thinner indium gallium phosphide (InGaP) nucleation layer between the gallium arsenide (GaAs) and the p-Ge substrate. The profile in FIG. 5 shows a two-step profile with a junction depth of 0.7 μm. The near surface concentration is due to the presence of phosphorus (P) whereas the region between 0.3 μm and 0.7 μm is due to the presence of arsenic (As). A two-step diffusion profile such as that in FIG. 5 may serve as a built-in field to help carrier collection in the emitter layer. The data in FIGS. 3 through 5 clearly indicates the effectiveness of the indium gallium phosphide (InGaP) nucleation layer in the formation of a shallow diffused germanium (Ge) junction.

The solubility of phosphorus (P) is higher than that of arsenic (As), but the diffusion constant of P is lower than that of As. As a result, arsenic (As) diffuses into germanium (Ge) further than phosphorus (P) in lower concentrations. When the indium gallium phosphide (InGaP) nucleation layer is thicker than 350 Å, the n-doping in the germanium (Ge) junction is primarily through the phosphorus (P) diffusion, and the emitter thickness is typically 300 nm with carrier concentration of $\sim 5 \times 10^{19}$ cm$^{-3}$. However, when the thickness of the indium gallium phosphide (InGaP) nucleation layer is less than 350 Å, both the arsenic (As) and the phosphorus (P) are present in the germanium (Ge) and the n-p junction is pushed further into the germanium by arsenic (As) diffusion through the indium gallium phosphide (InGaP) nucleation layer. This two-step diffusion profile may advantageously optimize the current and voltage generated from the germanium (Ge) junction.

As described above, the diffusion of the arsenic (As) and/or the phosphorus (P) into a germanium (Ge) substrate is done primarily by solid phase diffusion. It has been found that a 350 Å layer of indium gallium phosphide (InGaP) is enough to block the diffusion of arsenic (As) into germanium (Ge). A layer less than 240 Å, however, will allow both the arsenic (As) and phosphorus (P) to diffuse into germanium (Ge). As a result, both arsenic (As) and phosphorus (P) dopants are able to coexist in germanium (Ge). The diffusion of arsenic (As) and phosphorus (P) into germanium (Ge) from the gas phase during the oxide desorption of the germanium (Ge) substrates can be also significant. Thus, the use of a low enough hydride flow rate will minimize the arsenic (As) and phosphorus (P) diffusion into the germanium (Ge) junction.

The composition of the indium gallium phosphide (InGaP) nucleation layer can range from 0 to 1. Either indium phosphide (InP) or gallium phosphide (GaP) can be used as the nucleation layer since the thickness can be thin enough to keep the lattice-mismatched layer grown coherently.

Figure 6:
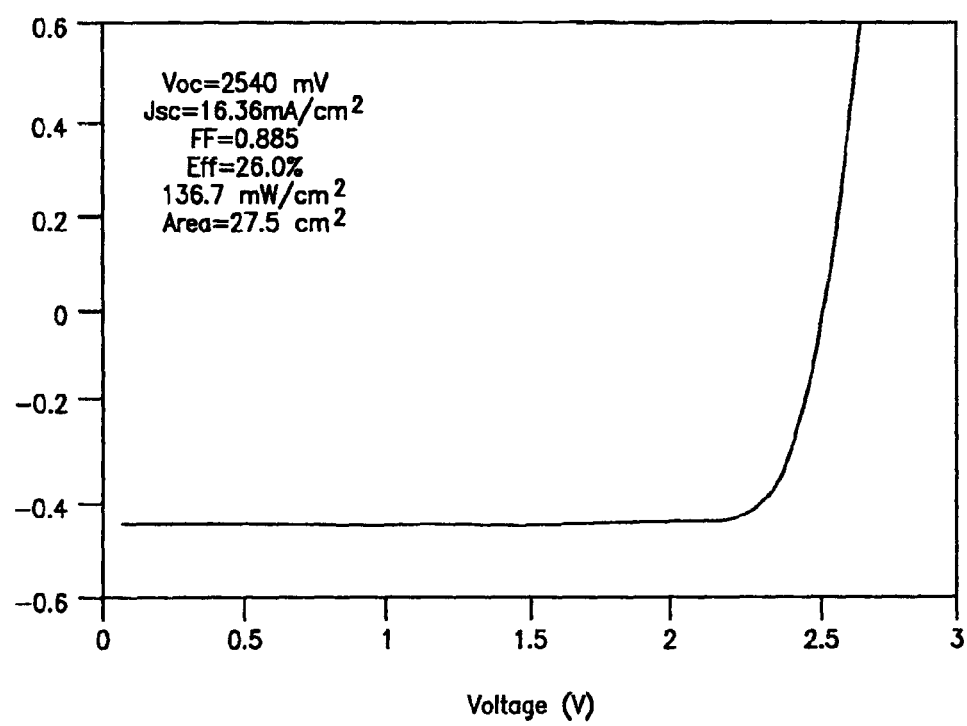
FIG. 6 shows the light current-voltage characteristic of a triple junction solar cell containing an InGaP nucleation layer between the GaAs middle cell and the Ge substrate in accordance with the present invention in FIG. 2.

FIG. 6 shows the light current-voltage characteristic of an triple junction solar cell containing an InGaP nucleation layer between the GaAs middle cell and the Ge substrate in accordance with the present invention in FIG. 2. FIG. 6 shows the data for a 27.5 cm² device subject to 1 sun AM0 illumination incident upon the cell operating at 28° C. In this example the triple junction is current-limited by the top cell so as to provide radiation hardness. In other words this embodiment is that of an end-of-life (EOL) optimized design. A beginning-of-life design can be implemented by simply adjusting the thickness of the top InGaP cell such that its $J_{sc}$ is equal to that of the GaAs middle cell.

While we have described our preferred embodiments of the present invention, it is understood that those skilled in the art, both now and in the future, may make various improvements and enhancements which fall within the scope of the claims which follow. These claims should be construed to maintain the proper protection for the invention first disclosed.

What is claimed is:

1. A solar cell comprising:
   a first subcell including a bulk germanium (Ge) substrate composed entirely of doped or undoped germanium, the bulk Ge substrate having a diffusion region doped with n-type dopants including phosphorus and arsenic, wherein an upper portion of such diffusion region has a higher concentration of phosphorus (P) atoms than arsenic (As) atoms, wherein the diffusion region further includes a lower portion, and As atoms have a higher concentration compared to P atoms in the lower portion,
   a second subcell including a layer of either gallium arsenide (GaAs) or indium gallium arsenide (InGaAs) disposed over the bulk Ge substrate,
   a nucleation layer in direct physical contact with the bulk Ge substrate, wherein the nucleation layer controls the diffusion of As atoms into the substrate, the nucleation layer being devoid of arsenic.

2. A solar cell as recited in claim 1 wherein the nucleation layer has a lattice parameter substantially equal to the lattice parameter of the germanium substrate.

3. A solar cell as recited in claim 1 wherein the nucleation layer is a compound of InGaP.

4. A solar cell as recited in claim 1 wherein the nucleation layer has a thickness equal to 350 angstroms or less.

5. A solar cell defined in claim 1 wherein a junction in the germanium substrate is located between 0.3 μm and 0.7 μm from the top surface of the germanium substrate.

6. A solar cell as defined in claim 1 wherein diffused phosphorus and arsenic in the germanium substrate have a diffusion profile arranged to provide current and voltage characteristics that optimize the power output of the solar cell.

7. A solar cell as defined in claim 1 further comprising a third subcell disposed over the second subcell.

8. A solar cell as defined in claim 1 wherein the diffusion region comprises a two-step diffusion profile.

9. A solar cell as recited in claim 1 wherein the germanium substrate is p-type.

10. A solar cell as recited in claim 9 wherein the diffusion region corresponds to an n-type portion of a shallow n-p junction in the germanium substrate.

11. A solar cell as recited in claim 7 wherein the third subcell is composed of InGaP.

12. A solar cell as recited in claim 1 further comprising a buffer layer disposed over said nucleation layer.

13. A solar cell as recited in claim 12 wherein the buffer layer is composed of GaAs.

14. A solar cell as recited in claim 11 wherein the thickness of the third subcell is configured so that the short circuit current of the third subcell is equal to the short circuit current of the second subcell.

15. A solar cell as recited in claim 1 wherein the depth of diffusion of the As dopant in the two-step diffusion region is greater than a depth of diffusion of the P dopant in the two-step diffusion region.

* * * * *